(12) United States Patent
Chen et al.

(10) Patent No.: US 11,433,427 B2
(45) Date of Patent: Sep. 6, 2022

(54) ULTRASONIC TRANSDUCER

(71) Applicant: Unictron Technologies Corporation, Hsin-Chu (TW)

(72) Inventors: Lung Chen, Taipei (TW); Yi-Ting Su, Hsinchu (TW); Tsung-Shou Yeh, Hsinchu County (TW)

(73) Assignee: Unictron Technologies Corporation, Hsin-Chu (TW)

( * ) Notice: Subject to any disclaimer, the term of this patent is extended or adjusted under 35 U.S.C. 154(b) by 429 days.

(21) Appl. No.: 16/826,323

(22) Filed: Mar. 23, 2020

(65) Prior Publication Data
US 2021/0046507 A1  Feb. 18, 2021

(30) Foreign Application Priority Data

Aug. 16, 2019  (TW) .................................. 108210944

(51) Int. Cl.
| | | |
|---|---|---|
| *B06B 1/06* | (2006.01) | |
| *H01L 41/053* | (2006.01) | |
| *H01L 41/187* | (2006.01) | |
| *H01L 41/083* | (2006.01) | |

(52) U.S. Cl.
CPC ............ *B06B 1/067* (2013.01); *H01L 41/053* (2013.01); *H01L 41/083* (2013.01); *H01L 41/187* (2013.01)

(58) Field of Classification Search
None
See application file for complete search history.

(56) References Cited

U.S. PATENT DOCUMENTS

| | | | | |
|---|---|---|---|---|
| 5,329,682 | A  * | 7/1994 | Thum | B06B 1/067 |
| | | | | 29/25.35 |
| 2011/0105906 | A1 * | 5/2011 | Lee | G10K 11/004 |
| | | | | 600/459 |
| 2013/0049537 | A1 | 2/2013 | Kim | |
| 2014/0292147 | A1 * | 10/2014 | Kim | B06B 1/06 |
| | | | | 156/280 |
| 2018/0290176 | A1 * | 10/2018 | Fukase | B06B 1/0685 |
| 2020/0376520 | A1 * | 12/2020 | Chen | H04R 17/005 |
| 2021/0113187 | A1 * | 4/2021 | Morita | H01L 41/04 |

FOREIGN PATENT DOCUMENTS

| | | |
|---|---|---|
| CN | 1578900 A | 2/2005 |
| WO | 03/064980 A1 | 8/2003 |

\* cited by examiner

*Primary Examiner* — Benjamin P Sandvik
(74) *Attorney, Agent, or Firm* — Winston Hsu

(57) ABSTRACT

An ultrasonic transducer includes a piezoceramic element, a first acoustic matching layer with extending sidewall attaching the lateral surface of the piezoceramic element, wherein the thickness of the first acoustic matching layer is smaller than ¼ wavelength of an ultrasonic wave emitted by the piezoceramic element in the first acoustic matching layer in an operating frequency of the ultrasonic transducer, and the height of the sidewall of the first acoustic matching layer is larger than 1/20 height of the lateral surface of the piezoceramic element, and a second acoustic matching layer attaching the first acoustic matching layer.

12 Claims, 4 Drawing Sheets

ULTRASONIC TRANSDUCER

BACKGROUND OF THE INVENTION

1. Field of the Invention

The present invention relates generally to an ultrasonic transducer, and more specifically, to an ultrasonic transducer with dual acoustic matching layers.

2. Description of the Prior Art

Ultrasonic transducer may be used in short-range object detection. Through calculation of the time difference between emitting waves and reflected waves from objects, the distance between ultrasonic transducer and detected object may be obtained. In the field of ultrasonic detection, the types and properties of objects to be detected is not quite restrictive. Solid, liquid or particle with various surface colors, transparencies and hardness may all be detected by using the ultrasonic transducer. Therefore, the ultrasonic transducer nowadays is widely used in the fields like parking sensors, level sensors, multiple sheet detection and flow meter.

The main component of an ultrasonic transducer is piezoceramic element, for example, the ceramic element made of lead zirconate titanate (PZT) material with two opposite surfaces coated with conductive layers to apply high-frequency alternating current signal in the operation, so that the piezoceramic element would generate high-frequency vibration. This high-frequency vibration is a kind of wave energy. It may be in a form of ultrasonic wave, i.e. ultrasonic vibration, if its wavelength falls within the range of ultrasound. However, in order to transmit the generated ultrasonic waves from the piezoceramics into air, the acoustic impedances of piezoceramics and air should be matched.

The formula to calculate the acoustic impedance (Z) is $Z=\rho \cdot c$ ($\rho$=material density, c=ultrasonic velocity). The acoustic impedance of piezoceramic is about 30-35 MRayl ($10^6$ kg/m$^2 \cdot$S), while the acoustic impedance of air is about 430 Rayl (kg/m$^2 \cdot$S). Since there is a huge gap between the acoustic impedances of piezoceramic and air, the ultrasonic energy generated by the piezoceramic can't be transmitted to air. Therefore, the acoustic matching layer becomes a critical component in ultrasonic transducers. The acoustic matching layer is designed to be disposed between the piezoceramic and air to match the acoustic impedances thereof, so that the ultrasonic wave may be effectively transmitted to air. The ideal value of acoustic impedance for the acoustic matching layer used in air transducer is $\sqrt{(35 M \cdot 430)}$ Rayl, i.e. about 0.12 MRayl. However, it is hard to find a durable material with acoustic impedance lower than 1 MRayl in nature. Therefore, commonly-used material of the acoustic matching layer in transducer industry is composite material with mixed polymer resin and hollow glass particles, to achieve lower acoustic impedance, and at the same time, provide better weatherability and reliability.

SUMMARY OF THE INVENTION

The summary of present invention is provided in following paragraphs to assist readers having a better understanding of the subject matter of present invention. The summary is presented to be not exhaustive and/or exclusive to the features and advantages of the present invention, and doesn't intend to list all crucible or essential elements or to limit the scope of present invention. With the purpose just to provide certain concepts relied therein to be described through embodiments in a simplified form, detailed features and advantages of the invention will become apparent in the following description, from the drawings, and from the claims.

The objective of the present invention is to provide a novel ultrasonic transducer with sidewall features extending from an edge of the acoustic matching layer to enhance the connection between components, thereby preventing peelings or damages between the piezoceramic element and the acoustic matching layer due to high-frequency vibration.

One aspect of the present invention is to provide an ultrasonic transducer, including a piezoceramic element with a first surface, a second surface opposite to the first surface across the piezoceramic element and a lateral surface connecting the first surface and the second surface, a first acoustic matching layer with a base and a sidewall extending from an edge of the base, wherein the base is provided with a third surface and a fourth surface opposite to the third surface across the base, and the third surface is attached with the second surface of the piezoceramic element, and an inner surface of the sidewall of the first acoustic matching layer is attached with the lateral surface of the piezoceramic element, and wherein a thickness of the base of the first acoustic matching layer is smaller than ¼ wavelength of an ultrasonic wave emitted by the piezoceramic element in the first acoustic matching layer in an operating frequency of the ultrasonic transducer, and a height of the sidewall of the first acoustic matching layer is larger than 1/20 height of the lateral surface of the piezoceramic element, and a second acoustic matching layer with a fifth surface and a sixth surface opposite to the fifth surface across the second acoustic matching layer, and the fifth surface is attached with the fourth surface of the first acoustic matching layer.

Another aspect of the present invention is to provide an ultrasonic transducer with a barrel-shaped carrier for accommodating piezoceramic elements and acoustic matching layers.

Still another aspect of the present invention is to provide an ultrasonic transducer with a tubular carrier for accommodating piezoceramic elements and acoustic matching layers.

Still another aspect of the present invention is to provide an ultrasonic transducer with damping elements encapsulating piezoceramic elements for providing damping effect.

Still another aspect of the present invention is to provide an ultrasonic transducer, whose second acoustic matching layer is provided with protruding edges to attach with the sidewall of the first acoustic matching layer.

Still another aspect of the present invention is to provide an ultrasonic transducer, whose first acoustic matching layer is provided with solid particles, organic fibers, inorganic fibers or mesh sheet to control the thickness of the first acoustic matching layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
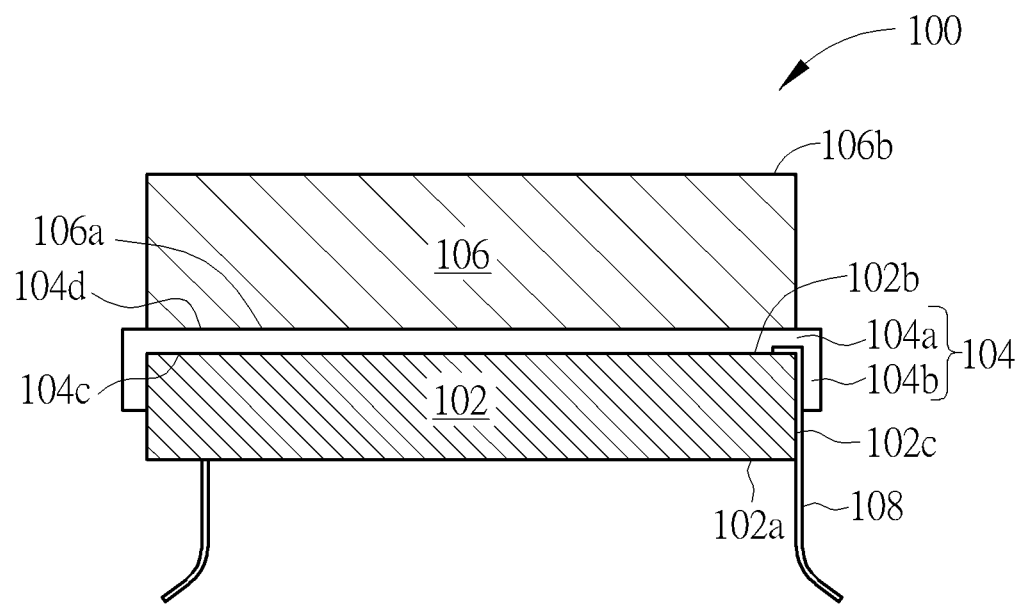
FIG. 1 is a cross-sectional view illustrating one mode of the ultrasonic transducer in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Dimensions and proportions of certain parts of the drawings may have been shown exaggerated or reduced in size, for the sake of clarity and convenience in the drawings. Other embodiments may be utilized and structural, logical, and electrical changes may be made without departing from the scope of the present invention. The following detailed description, therefore, is not to be taken in a limiting sense, and the scope of the present invention is defined by the appended claims.

First, please refer to FIG. 1, which is a cross-sectional view illustrating one mode of the ultrasonic transducer 100 in accordance with one embodiment of the present invention. In this embodiment, the ultrasonic transducer 100 includes a piezoelectric element 102 with a first surface 102a, a second surface 102b opposite to the first surface 102a across the piezoelectric element 102 and a lateral surface 102c connecting the first surface 102a and the second surface 102b. The piezoceramic element 102 may include solid piezoceramic material in a shape of square, polygon or circle, or ringlike piezoceramic material, or multilayer piezoceramic material, or a piezoceramic material with grooves. These piezoceramic materials may include leaded piezoceramic material like $Pb(ZrTi)O_3$, $PbTiO_3$, or unleaded piezoceramic material like $BaTiO_3$, $(NaK)NbO_3$, with an acoustic impedance about 30-35 MRayl much greater than the acoustic impedance of air (about 430 Rayl), thus an acoustic matching layer is required to match the acoustic impedances in these two mediums. The conductive layer on the piezoceramic element 102 may be connected with conductive wires 108 to electrically connect external high-frequency alternating current signal to the piezoceramic element 102 and generate high-frequency vibration to emit ultrasonic waves. A first acoustic matching layer 104 is provided with a base 104a and a sidewall 104b extending from an edge of the base 104a. The base 104a further includes a third surface 104c and a fourth surface 104d opposite to the third surface 104c across the base 104a, wherein the third surface 104c is attached on and directly contacts the second surface 102b of the piezoceramic element 102. In the embodiment of present invention, the thickness of the first acoustic matching layer 104 should be smaller than ¼ wavelength of the ultrasonic wave emitted by the piezoceramic element 102 in the first acoustic matching layer 104 in an operating frequency of the ultrasonic transducer 100, to achieve optimal ultrasonic transmission.

Please note that, in the embodiment of the present invention, the inner surface of the sidewall 104b of the first acoustic matching layer 104 is attached with the lateral surface 102c of the piezoceramic element 102, thereby enhancing the connection between the first acoustic matching layer 104 and the piezoceramic element 102 and preventing peelings or damages between the piezoceramic element 102 and the first acoustic matching layer 104 due to high-frequency vibration. A height of the sidewall 104b of the first acoustic matching layer 104 is larger than ½₀ height of the lateral surface 102c of the piezoceramic element 102 to provide sufficient connection effect. The material of the first acoustic matching layer 104 may be organic polymer materials or composite materials made of organic polymer materials mixing with hollow particles or solid particles. The material of organic polymer materials includes epoxy, vinyl ester resin, acrylic resin, polyurethane or UV resin. The hollow particles or solid particles may be hollow glass particles or solid glass particles, as a filler to be uniformly distributed in the organic polymer materials to adjust total density of the first acoustic matching layer 104. The density of hollow glass particles is between 0.1 g/cm³ to 0.6 g/cm³. Since the acoustic impedance is proportional to the density of material, the lower the density of first acoustic matching layer 104 is, the lower the acoustic impedance is obtained, so that better acoustic matching may be achieved. The first acoustic matching layer 104 may be modulated with different densities by adding the glass particles with different percentage by volume into the organic polymer materials and undergo mixing, degasing and curing treatment.

Refer again to FIG. 1. A second acoustic matching layer 106 with a fifth surface 106a and a sixth surface 106b opposite to the fifth surface 106a across the second acoustic matching layer 106, and the fifth surface 106a is attached with the fourth surface 104d of the first acoustic matching layer. The second acoustic matching layer 106 is adhered tightly on the piezoceramic element 102 through the first acoustic matching layer 104 to forma dual-layered acoustic matching layer structure. In the embodiment of present invention, the second acoustic matching layer 106 may be organic polymer materials or composite materials made of organic polymer materials mixing with hollow particles or solid particles. The material of organic polymer materials includes epoxy, vinyl ester resin, UV resin, polyurethane, acrylic resin or cyanate ester resin. The hollow particles or solid particles may be hollow glass particles or solid glass particles, as a filler to be uniformly distributed in the organic polymer materials to adjust total density of the second acoustic matching layer 106. The density of hollow glass particles is between 0.1 g/cm$^3$ to 0.6 g/cm$^3$. Since the acoustic impedance is proportional to the density of material, the lower the density of second acoustic matching layer 106 is, the lower the acoustic impedance is obtained, so that better acoustic matching may be achieved. The second acoustic matching layer 106 may be modulated with different densities by adding the glass particles with different percentage by volume into the organic polymer materials and undergo mixing, degasing and curing treatment.

Figure 2:
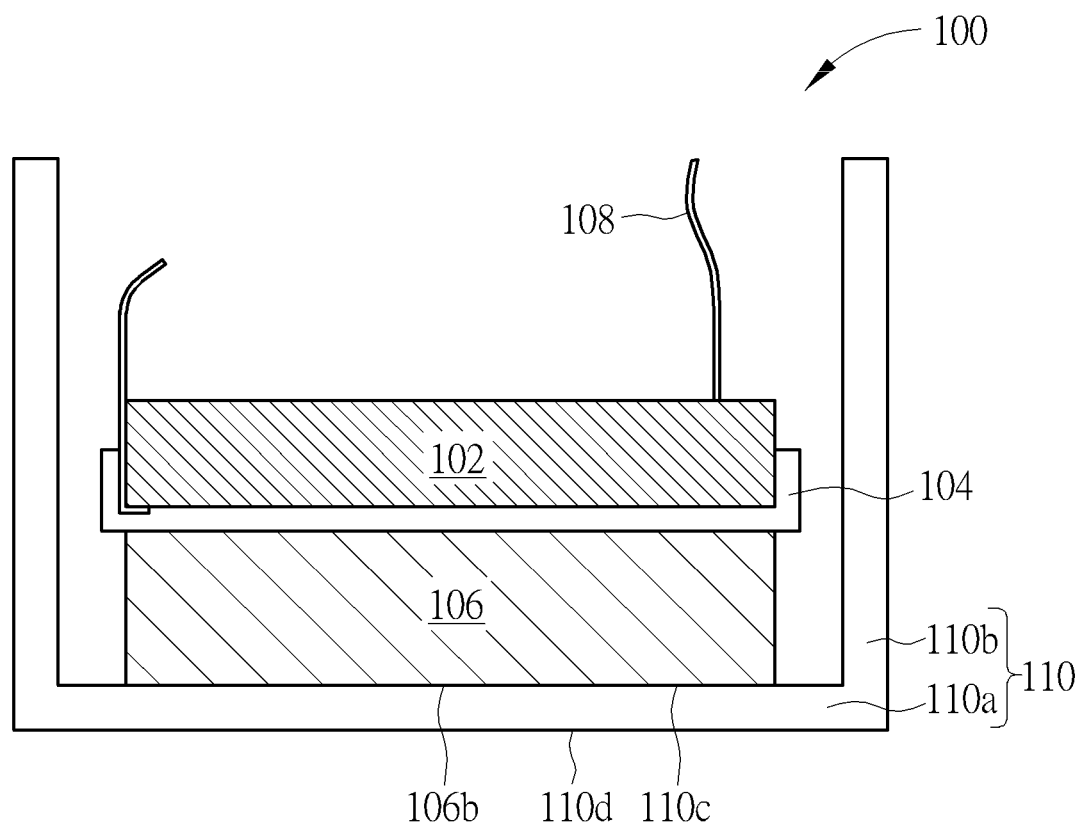
FIG. 2 is a cross-sectional view illustrating another mode of the ultrasonic transducer in accordance with one embodiment of the present invention.

Next, please refer to FIG. 2. The ultrasonic transducer 100 of the present invention may be disposed in a barrel-shaped carrier 110. The barrel-shaped carrier 110 is made of a carrier base 110*a* and a carrier sidewall 110*b*, wherein the barrel-shaped carrier 110 is provide with a seventh surface 110*c* and an eighth surface 110*d* opposite to the seventh surface 110*c* across the carrier base 110*a*, and the piezoceramic element 102, the first acoustic matching layer 104 and the second acoustic matching layer 106 are disposed in the barrel-shaped carrier 110, and the sixth surface 106*d* of the second acoustic matching layer 106 is attached on and directly contacts the seventh surface 110*c* of the carrier base 110*a* of the barrel-shaped carrier 110. This design is more suitable for the ultrasonic transducer to be used in external harsh environment, to effectively protect the acoustic matching layers from damage. The material of the barrel-shaped carrier 110 may be selected from metallic materials of following group or the combination thereof: aluminum, titanium, copper, stainless steel, or is selected from non-metallic materials of following group or the combination thereof: glass, acrylic, polytetrafluoroethylene (PTFE), polyvinylidene difluoride (PVDF), polypropylene (PP), polyethylene (PE), polyvinyl chloride (PVC), polybutylene terephthalate (PBT), acrylonitrile butadiene styrene (ABS), polyphenylene sulfide (PPS), liquid-crystal polymer (LCP) or polyether ether ketone (PEEK).

Figure 3:
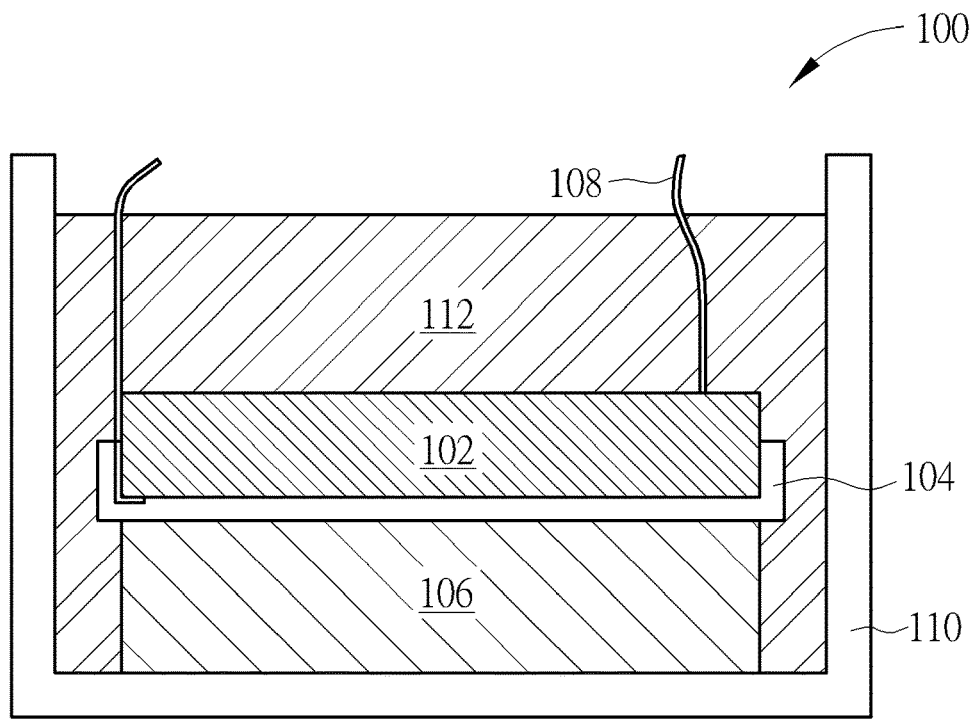
FIG. 3 is a cross-sectional view illustrating still another mode of the ultrasonic transducer in accordance with one embodiment of the present invention.

Next, please refer to FIG. 3. In addition to the aforementioned components, the ultrasonic transducer 100 of the present invention may further include damping structure. As shown in FIG. 3, a damping element 112 is disposed in the barrel-shaped carrier 110. The damping element 112 is disposed in the space between the barrel-shaped carrier 110 and the piezoceramic element 102 and encapsulates the piezoceramic element 102, so that the damping element 112 may effectively damping the piezoceramic element 102 in high-frequency vibration and reset it into static state. This function facilitates the operation of ultrasonic transducer. The damping element 112 may also fix the conductive wires 108.

Figure 4:
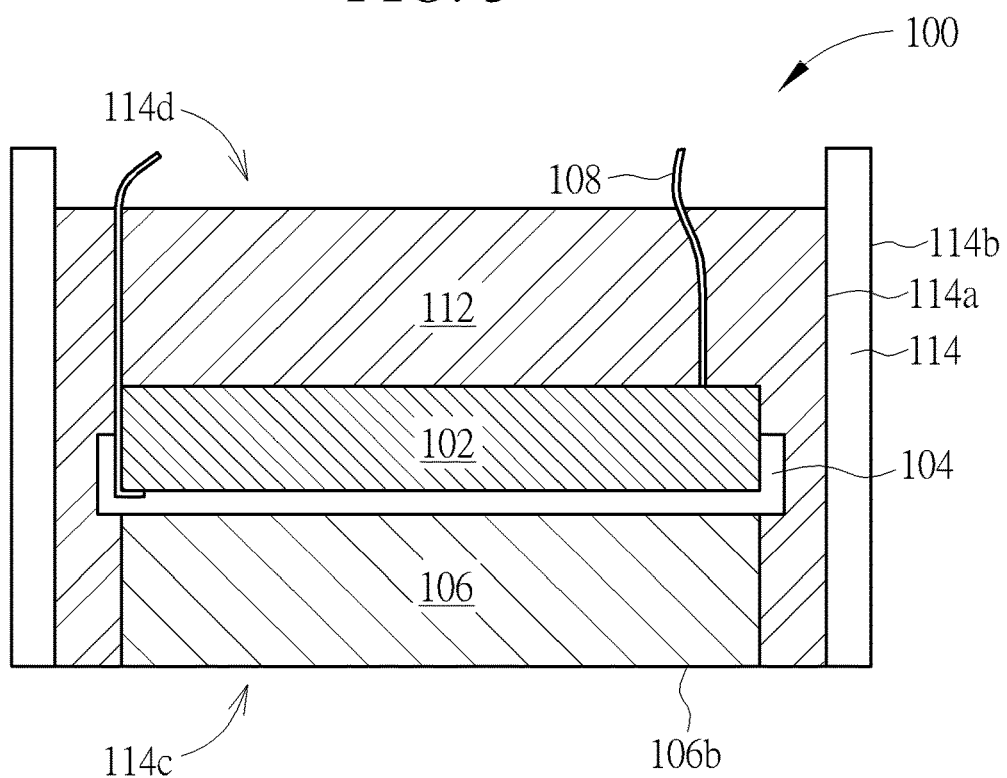
FIG. 4 is a cross-sectional view illustrating still another mode of the ultrasonic transducer in accordance with one embodiment of the present invention.

Next, please refer to FIG. 4, which is a cross-sectional view illustrating another mode of the ultrasonic transducer in accordance with one embodiment of the present invention. In the embodiment of FIGS. 2-3, the piezoceramic element and the acoustic matching layers are disposed on the barrel-shaped carrier. However, in the embodiment of present invention, the piezoceramic element and the acoustic matching layers are disposed on a tubular carrier. As shown in the figure, the ultrasonic transducer 100 includes a tubular carrier 114 with an inner surface 114*a*, an outer surface 114*b* opposite to the inner surface 114*a* across the tubular carrier 114, a first opening 114*c* and a second opening 114*d* opposite to the first opening 114*c* across the tubular carrier 114, and a damping element 112 encapsulating the piezoceramic element 102, first acoustic matching layer 104 and second acoustic matching layer 106, wherein the inner surface 114*a* of the tubular carrier 114 surrounds and contacts the damping element 112, so that the piezoceramic element 102 and the acoustic matching layers 104/106 are fixed on the tubular carrier 114, and the sixth surface 106*b* of the second acoustic matching layer 106 is exposed from the first opening 114*c* of the tubular carrier 114. The material of the barrel-shaped carrier 114 may be selected from metallic materials of following group or the combination thereof: aluminum, titanium, copper, stainless steel, or is selected from non-metallic materials of following group or the combination thereof: glass, acrylic, polytetrafluoroethylene (PTFE), polyvinylidene difluoride (PVDF), polypropylene (PP), polyethylene (PE), polyvinyl chloride (PVC), polybutylene terephthalate (PBT), acrylonitrile butadiene styrene (ABS), polyphenylene sulfide (PPS), liquid-crystal polymer (LCP) or polyether ether ketone (PEEK). Other detailed features of the ultrasonic transducer of the present embodiment are identical to the ultrasonic transducer shown in FIG. 3. Those features will not be herein repeated.

Figure 5:
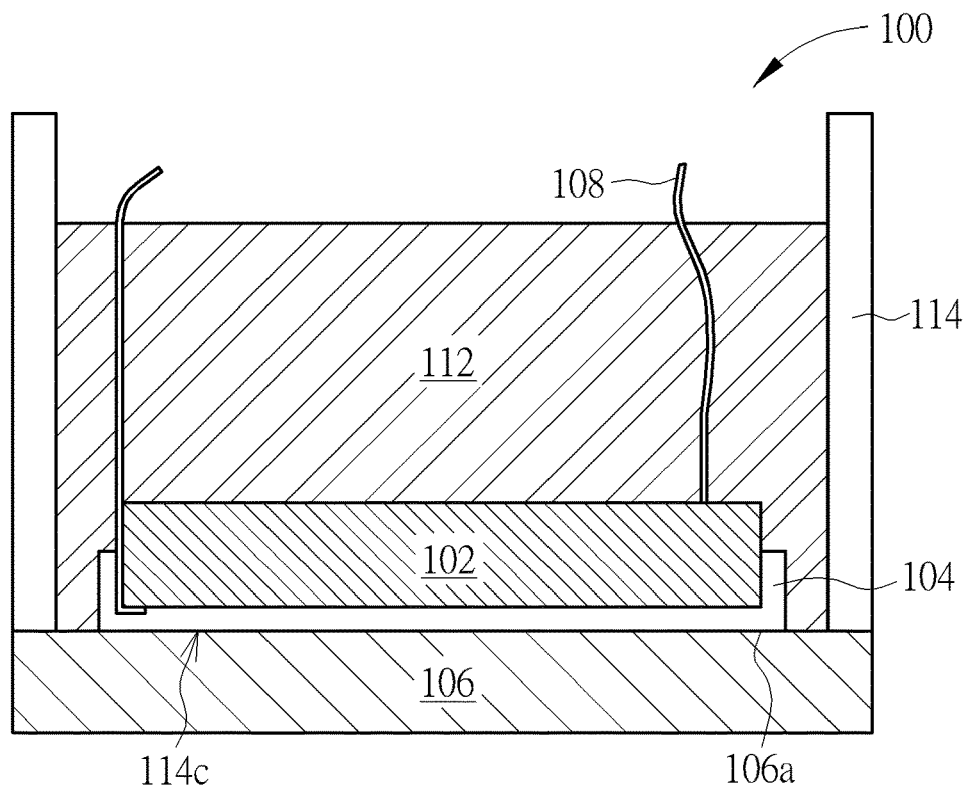
FIG. 5 is a cross-sectional view illustrating still another mode of the ultrasonic transducer in accordance with one embodiment of the present invention.

Next, please refer to FIG. 5, which is a cross-sectional view illustrating another mode of the ultrasonic transducer in accordance with one embodiment of the present invention. The ultrasonic transducers in the embodiments of FIG. 5 and FIG. 4 are essentially the same, with the only difference lies in the second acoustic matching layer 106 of the ultrasonic transducer 100 is disposed outside the tubular carrier 114, and the edge of the fifth 106*a* of the second acoustic matching layer 106 is attached with one end of the tubular carrier 114 at the first opening 114*c*. This design allows the second acoustic matching layer 106 and the tubular carrier 114 to constitute a barrel-like carrier structure. Thereafter, damping material may be filled in the tube to form damping element 112. In comparison to the tubular carrier in the embodiment of FIG. 4, the advantage of this embodiment is facilitating the manufacture, and the shape of product may be easily customized.

Figure 6:
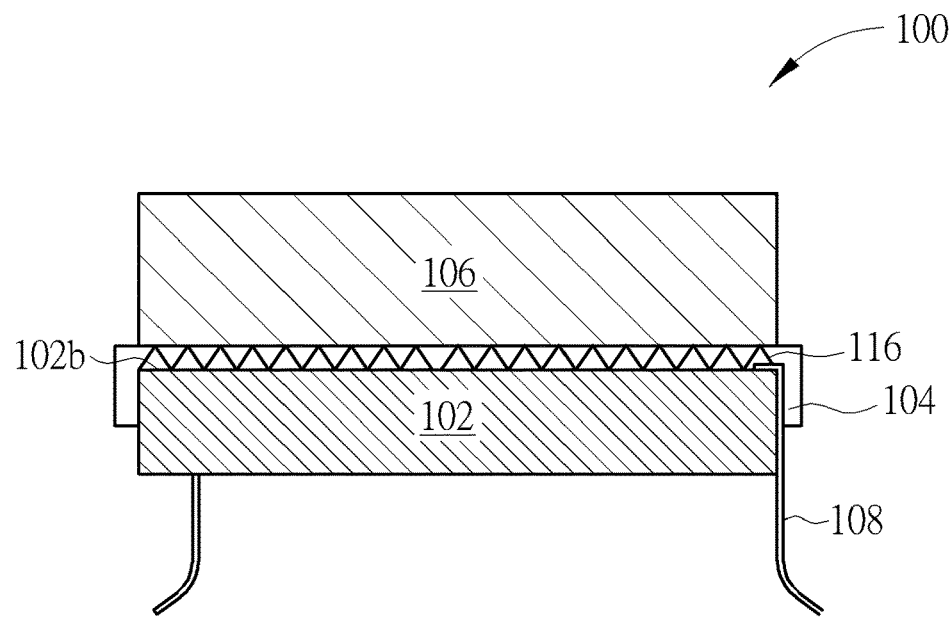
FIG. 6 is a cross-sectional view illustrating still another mode of the ultrasonic transducer in accordance with one embodiment of the present invention.

Next, please refer to FIG. 6. In the embodiment of the present invention, a mesh sheet 116 with tiny openings may be further disposed in the first acoustic matching layer 104 to precisely control the thickness of the first acoustic matching layer 104 and obtain excellent acoustic matching. In real implementation, the mesh sheet 116 is first put on a predetermined surface that is to be formed with the first acoustic matching layer 104, such as the second surface 102*b* of the piezoceramic element 102. The material of the first acoustic matching layer 104 is then uniformly applied on the mesh sheet 116 and the second surface 102*b* of the piezoceramic element 102, so that the material and the mesh sheet 116 combine to form the first acoustic matching layer 104. The material of the mesh sheet is selected from metallic materials of following group or the combination thereof: copper, iron, nickel, stainless steel, aluminum or titanium, or is selected from non-metallic materials of following group: polytetrafluoroethylene (PTFE), polyethylene terephthalate (PET), organic fiber, inorganic fiber, Nylon, carbon fiber or glass fiber.

Due to the presence of mesh sheet, when the second acoustic matching layer 106 is pressed on the material of first acoustic matching layer 104 in later process, the material of the first acoustic matching layer 104 may function as an adhesive to bind the second acoustic matching layer 106 tightly on the piezoceramic element 102. The mesh sheet 116 within the first acoustic matching layer 104 provides mechanical support to make the thickness of the pressed first acoustic matching layer 104 equal to the thickness of the mesh sheet 116 and achieve precise control of the thickness of the acoustic matching layer. In addition, since the coefficient of thermal expansion of the first acoustic matching layer 104 may be much greater than the coefficient of thermal expansion of the piezoceramic element 102 on which it attaches, the mesh sheet 116 within the first acoustic matching layer 104 may also absorb the stress generated by the matching layers to prevent the failure of device's reliability.

Figure 7:
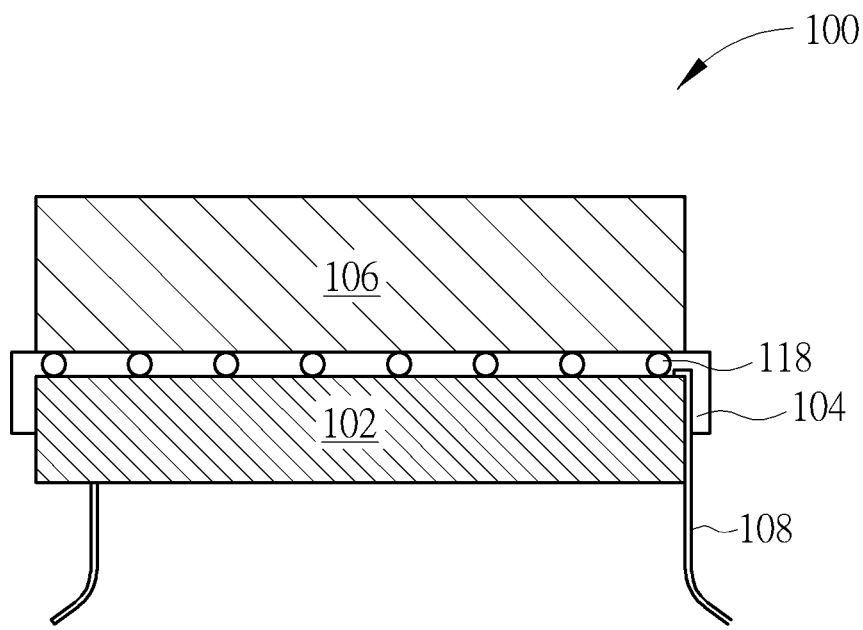
FIG. 7 is a cross-sectional view illustrating still another mode of the ultrasonic transducer in accordance with one embodiment of the present invention.

Next, please refer to FIG. 7. In addition to the mesh sheet 116, in other embodiment, solid particles 118, such as solid glass particles, may be used to control the thickness of the first acoustic matching layer 104. Other detailed features of the ultrasonic transducer in this present embodiment are identical to the ultrasonic transducer shown in FIG. 6. Those features will not be herein repeated.

Figure 8:
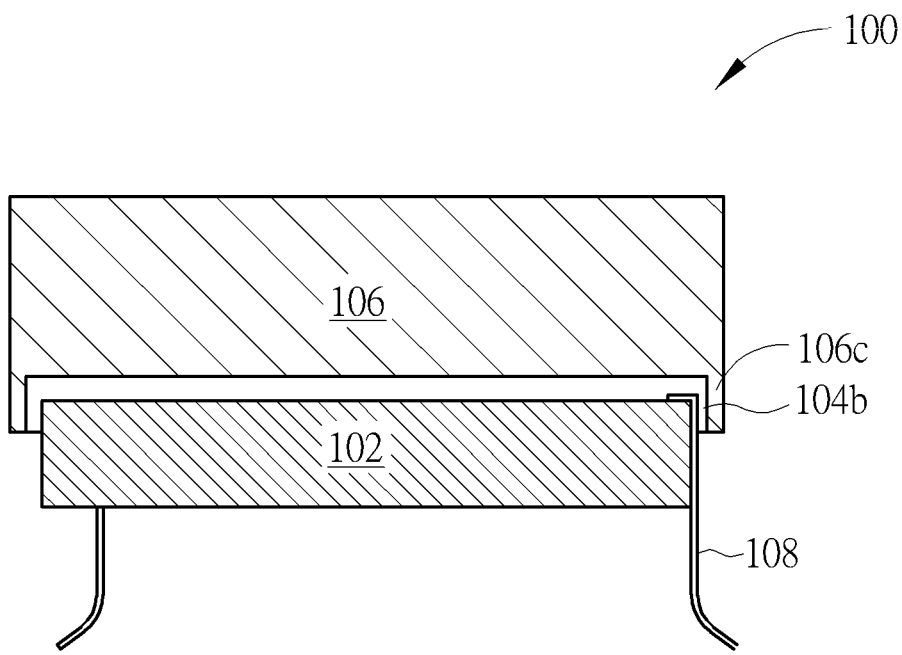
FIG. 8 is a cross-sectional view illustrating still another mode of the ultrasonic transducer in accordance with one embodiment of the present invention.

Next, please refer to FIG. 8, which is a cross-sectional view illustrating still another mode of the ultrasonic transducer in accordance with one embodiment of the present invention. In the embodiment, the second acoustic matching layer 106 may be further provided with a sidewall 106c extending from the edge of the second acoustic matching layer 106. The sidewall 106c of the second acoustic matching layer 106 surrounds and contacts the sidewall 104b of the first acoustic matching layer 104 to enhance the connection between the second acoustic matching layer 106 and the first acoustic matching layer 104, thereby preventing peelings or damages between the piezoceramic element 102, the second acoustic matching layer 106 and the first acoustic matching layer 104 due to high-frequency vibration.

According to the ultrasonic transducer made by the aforementioned exemplary embodiments, the sidewall extending from the edge of the acoustic matching layer may enhance the connection between components. Furthermore, the design of dual-layered acoustic matching structure may significantly increase the bandwidth of the ultrasonic transducer. In conclusion, it is an invention with both novelty and practicality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An ultrasonic transducer, comprising:
   a piezoceramic element with a first surface, a second surface opposite to said first surface across said piezoceramic element and a lateral surface connecting said first surface and said second surface;
   a first acoustic matching layer comprising a base and a sidewall extending from an edge of said base, wherein said base is provided with a third surface and a fourth surface opposite to said third surface across said base, and said third surface is attached with said second surface of said piezoceramic element, and an inner surface of said sidewall of said first acoustic matching layer is attached with said lateral surface of said piezoceramic element, and wherein a thickness of said base of said first acoustic matching layer is smaller than ¼ wavelength of an ultrasonic wave emitted by said piezoceramic element in said first acoustic matching layer in an operating frequency of said ultrasonic transducer, and a height of said sidewall of said first acoustic matching layer is larger than 1/20 height of said lateral surface of said piezoceramic element; and
   a second acoustic matching layer with a fifth surface and a sixth surface opposite to said fifth surface across said second acoustic matching layer, and said fifth surface is attached with said fourth surface of said first acoustic matching layer.

2. The ultrasonic transducer of claim 1, further comprising a barrel-shaped carrier with a carrier base and a carrier sidewall, wherein said barrel-shaped carrier is provided with a seventh surface and an eighth surface opposite to said seventh surface across said carrier base, and said piezoceramic element, said first acoustic matching layer and said second acoustic matching layer are disposed in said barrel-shaped carrier, and said seventh surface of said carrier base of said barrel-shaped carrier is attached with said sixth surface of said second acoustic matching layer.

3. The ultrasonic transducer of claim 2, further comprising a damping element disposed in said barrel-shaped carrier and encapsulating said piezoceramic element, said first acoustic matching layer and said second acoustic matching layer.

4. The ultrasonic transducer of claim 1, further comprising a tubular carrier with an inner surface, an outer surface opposite to said inner surface across said tubular carrier, a first opening and a second opening opposite to said first opening across said tubular carrier, and a damping element encapsulating said piezoceramic element, said first acoustic matching layer and said second acoustic matching layer, wherein said inner surface of said tubular carrier surrounds and contacts said damping element, and said sixth surface of said second acoustic matching layer is exposed from said first opening of said tubular carrier.

5. The ultrasonic transducer of claim 4, wherein an edge of said fifth surface of said second acoustic matching layer is attached with one end of said tubular carrier at said first opening.

6. The ultrasonic transducer of claim 1, wherein said second acoustic matching layer is provided with a sidewall extending from an edge of said second acoustic matching layer, and said sidewall of said second acoustic matching layer is attached with said sidewall of said first acoustic matching layer.

7. The ultrasonic transducer of claim 1, wherein said first acoustic matching layer comprises organic polymer materials or composite materials made of organic polymer materials mixing with hollow particles or solid particles, and a material of said organic polymer materials comprises epoxy, vinyl ester resin, acrylic resin, polyurethane or UV resin.

8. The ultrasonic transducer of claim 7, wherein said first acoustic matching layer further comprises solid particle, organic fiber, inorganic fiber or mesh sheet to control a thickness of said base of said first acoustic matching layer.

9. The ultrasonic transducer of claim 1, wherein said second acoustic matching layer comprises organic polymer materials or composite materials made of organic polymer materials mixing with hollow particles or solid particles, and said organic polymer materials comprises epoxy, vinyl ester resin, UV resin, polyurethane, acrylic resin or cyanate ester resin.

10. The ultrasonic transducer of claim 1, wherein said piezoceramic element comprises solid piezoceramic material in a shape of square, polygon or circle, or ringlike piezoceramic material, or multilayer piezoceramic material, or a piezoceramic material with grooves.

11. The ultrasonic transducer of claim 2, wherein a material of said barrel-shaped carrier is selected from metallic materials of following group or the combination thereof: aluminum, titanium, copper, stainless steel, or is selected from non-metallic materials of following group or the combination thereof: glass, acrylic, polytetrafluoroethylene (PTFE), polyvinylidene difluoride (PVDF), polypropylene (PP), polyethylene (PE), polyvinyl chloride (PVC), polybutylene terephthalate (PBT), acrylonitrile butadiene styrene (ABS), polyphenylene sulfide (PPS), liquid-crystal polymer (LCP) or polyether ether ketone (PEEK).

12. The ultrasonic transducer of claim 4, wherein a material of said tubular carrier is selected from metallic materials of following group or the combination thereof: aluminum, titanium, copper, stainless steel, or is selected from non-metallic materials of following group or the combination thereof: glass, acrylic, polytetrafluoroethylene (PTFE), polyvinylidene difluoride (PVDF), polypropylene (PP), polyethylene (PE), polyvinyl chloride (PVC), polybutylene terephthalate (PBT), acrylonitrile butadiene styrene (ABS), polyphenylene sulfide (PPS), liquid-crystal polymer (LCP) or polyether ether ketone (PEEK).

* * * * *